United States Patent
Savage et al.

(10) Patent No.: US 7,436,334 B2
(45) Date of Patent: Oct. 14, 2008

(54) AMPLIFIER, ANALOGUE TO DIGITAL CONVERTER, METHODS OF AMPLIFYING AND OF CONVERTING AN ANALOGUE INPUT SIGNAL TO A DIGITAL OUTPUT SIGNAL AND OF PRODUCING A MINERAL HYDROCARBON FLUID

(75) Inventors: William Mountjoy Savage, Houston, TX (US); Richard Martin Ostermeier, Houston, TX (US)

(73) Assignee: Shell Oil Company, Houston, TX (US)

( * ) Notice: Subject to any disclaimer, the term of this patent is extended or adjusted under 35 U.S.C. 154(b) by 0 days.

(21) Appl. No.: 11/689,980

(22) Filed: Mar. 22, 2007

(65) Prior Publication Data

US 2007/0257830 A1    Nov. 8, 2007

Related U.S. Application Data

(60) Provisional application No. 60/786,275, filed on Mar. 27, 2006.

(51) Int. Cl.
*H03M 1/62* (2006.01)
(52) U.S. Cl. .................. 341/139; 330/129
(58) Field of Classification Search ............. 341/155, 341/139; 330/129, 124 R; 455/136
See application file for complete search history.

(56) References Cited

U.S. PATENT DOCUMENTS

| | | | | |
|---|---|---|---|---|
| 5,729,174 | A * | 3/1998 | Dunnebacke et al. | 330/51 |
| 5,844,512 | A | 12/1998 | Gorin et al. | 341/139 |
| 5,923,213 | A | 7/1999 | Darthenay et al. | 330/51 |
| 5,955,884 | A | 9/1999 | Payton et al. | 324/339 |
| 6,288,664 | B1 | 9/2001 | Swanson | 341/155 |
| 6,486,808 | B1 | 11/2002 | Seppi et al. | 341/139 |
| 6,498,534 | B1 * | 12/2002 | Kim et al. | 330/136 |
| 6,836,229 | B2 | 12/2004 | Gregoire | 341/139 |
| 6,952,101 | B2 | 10/2005 | Gupta | 324/339 |

(Continued)

FOREIGN PATENT DOCUMENTS

EP    1494361 A1    1/2005

(Continued)

OTHER PUBLICATIONS

Data sheet Precision Instrumentation amplifier AD524 (Analog Devices, 1999).

(Continued)

*Primary Examiner*—Brian Young

(57) ABSTRACT

Amplifier comprising an input signal node for conveying an input signal having an input signal value and an output signal node for conveying an output signal having an output signal value. Amplifier circuitry is coupled to the input signal node and provided with a plurality of intermediate output signal nodes, each for conveying an intermediate output signal having an intermediate output signal value. The intermediate output signal value in each intermediate output signal node relates to the input signal value in accordance with predetermined signal gains. A signal selector selects one of the intermediate output signals and feeds the selected one to the output signal node. The amplifier may be comprised in an analogue to digital converter. The amplifier may be incorporated in a down hole tool. The method of amplification may be used in a method of producing a mineral hydrocarbon fluid.

11 Claims, 10 Drawing Sheets

U.S. PATENT DOCUMENTS

| | | | |
|---|---|---|---|
| 7,236,055 B2 * | 6/2007 | Halbert et al. | 330/256 |
| 2004/0235436 A1 | 11/2004 | Chao et al. | 455/126 |
| 2005/0068211 A1 | 3/2005 | Arai et al. | 341/138 |
| 2005/0083120 A1 | 4/2005 | Roos et al. | 330/86 |
| 2005/0092487 A1 | 5/2005 | Banning et al. | 166/254.1 |
| 2005/0093546 A1 | 5/2005 | Banning et al. | 324/338 |
| 2006/0038571 A1 | 2/2006 | Ostermeier et al. | 324/338 |
| 2006/0238253 A1 * | 10/2006 | Ohashi et al. | 330/254 |

FOREIGN PATENT DOCUMENTS

| | | |
|---|---|---|
| GB | 2326782 | 12/1998 |

OTHER PUBLICATIONS

Data sheet 8-input priority encoder 74F148 (Philips Semiconductors, 1990).

Data sheet LN161/LM261/LM361 High speed differential comparators (National semiconductors 1999).

Specifications and Architectures of Sample and hold Amplifiers, National Semiconductors application note AN 775 (1992).

TH2880 PCT, PCT/US2007/064613, International Search Report dated Jul. 19, 2007.

TH2880 PCT, PCT/US2006/064613, Written Opinion dated Jul. 19, 2007.

* cited by examiner

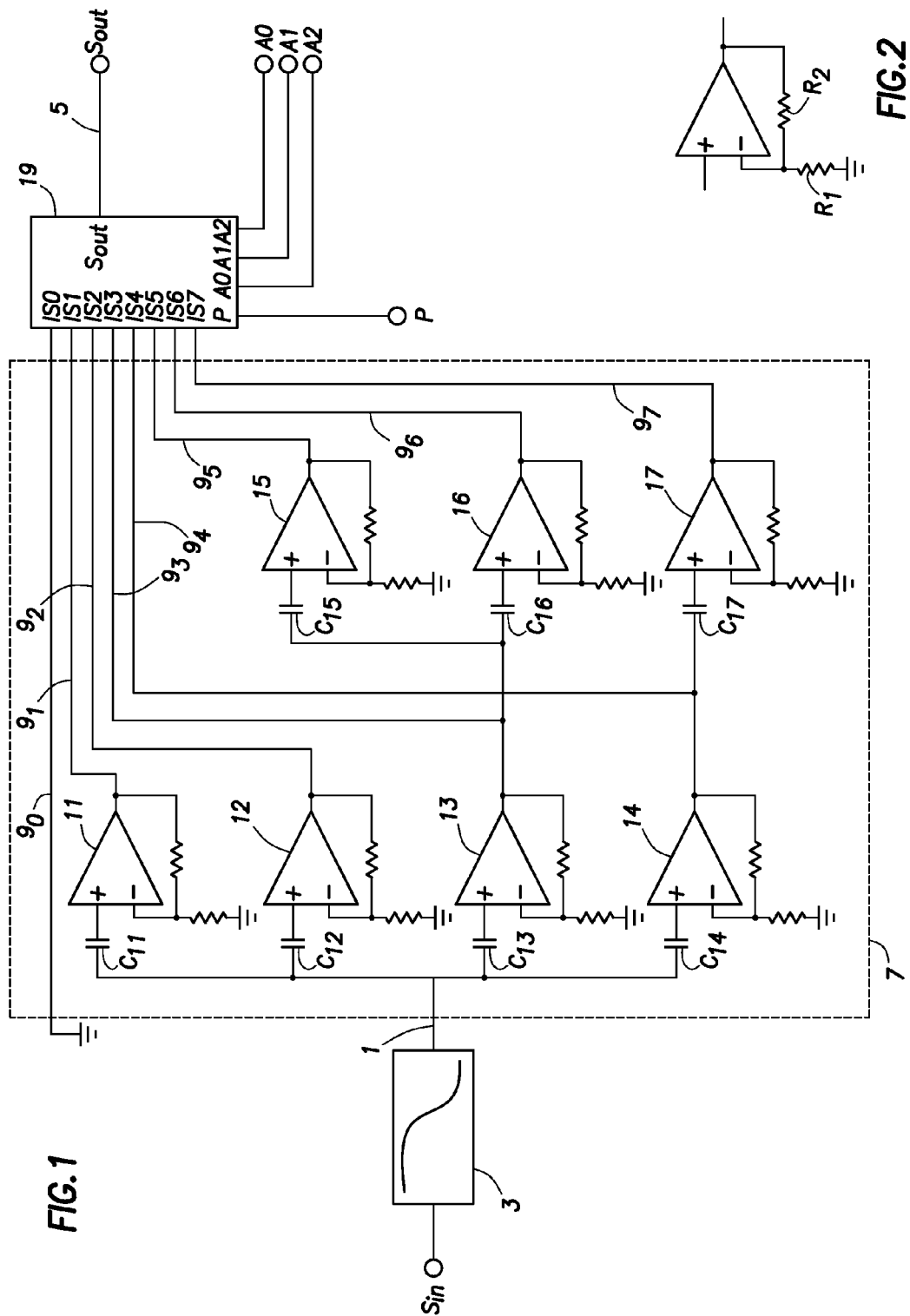

AMPLIFIER, ANALOGUE TO DIGITAL CONVERTER, METHODS OF AMPLIFYING AND OF CONVERTING AN ANALOGUE INPUT SIGNAL TO A DIGITAL OUTPUT SIGNAL AND OF PRODUCING A MINERAL HYDROCARBON FLUID

CROSS REFERENCE TO RELATED APPLICATION

The present application claims priority benefits of U.S. Provisional Application No. 60/786,275, filed 27 Mar. 2006.

FIELD OF THE INVENTION

In a first aspect, the invention relates to an amplifier. In another aspect, the invention relates to an analogue to digital converter. In still another aspect, the invention relates to a method of amplifying an input signal. In still another aspect, the invention relates to a method of converting an analogue input signal to a digital output signal. In still another aspect of the invention, there is provided a method of producing a mineral hydrocarbon fluid.

BACKGROUND OF THE INVENTION

In some areas of technology there is a need for reading and/or digitizing a time varying signal of which the value changes over many orders of magnitudes. In some cases the signal value changes can occur fast.

An example of such an area of technology involves measuring transient electromagnetic responses following excitations of an earth formation. U.S. patent applications published under numbers 2005/0092487, 2005/0093546, 2006/0038571, each incorporated herein by reference, describe such transient electromagnetic (EM) methods for locating an anomaly in a subterranean earth formation, and in particular for finding the direction and distance to a resistive or conductive anomaly in a formation surrounding a borehole, or ahead of the borehole, in drilling applications.

In these methods, typically a tool comprising a transmitter antenna, a receiver antenna, and a structural support, is lowered into a borehole in the earth formation. A transient response signal, comprising an induction voltage in the receiver antenna resulting from a sudden change in the current that is passed through the transmitter antenna, is measured. The referenced US patent applications show that response signals can decay from microvolts to nanovolts in microsecond times. This triggers a demand for high-speed high-dynamic range detection- and data acquisition circuitry.

Several methods and apparatus are known for improving the dynamic range in analogue to digital converters.

In some commercially available hand-held multi-meters, such as Volt-Ohm meters, gain switching circuitry is provided to switch between gain settings of a signal amplifier.

Roos et al, in a U.S. Pat. Application published under number 2005/0083120, disclose data signal amplification and processing switching circuitry with multiple signal gains for increasing dynamic signal range for X-ray imaging pixel value signals. The multiple signal gains are obtained by sequentially switching in more feedback capacity over a differential amplifier.

Such switching circuitry may introduce relatively long time lags through periods of gain switching, and time is also lost when the amplifier is set at a sub-optimal gain. Both result in loss of data during such periods.

SUMMARY OF THE INVENTION

According to a first aspect of the invention, there is provided an amplifier comprising
an input signal node for conveying an input signal having an input signal value;
an output signal node for conveying an output signal having an output signal value;
amplifier circuitry coupled to the input signal node and provided with at least a first intermediate output signal node for conveying a first intermediate output signal having a first intermediate output signal value, and a second intermediate output signal node for conveying a second intermediate output signal having a second intermediate output signal value, whereby the first intermediate output signal value relates to the input signal value in accordance with a predetermined first signal gain and the second intermediate output signal value relates to the input signal value in accordance with a predetermined second signal gain, which predetermined second signal gain is at least ten times higher than the predetermined first signal gain;
a signal selector arranged to select one of the intermediate output signals and to feed the selected one to the output signal node.

In a next aspect of the invention, there is provided an analogue to digital converter, comprising an amplifier as defined above, and analogue to digital conversion circuitry, coupled to at least the one output signal node, to convert the selected output signal.

In accordance with another aspect of the invention, there is provided a method of amplifying an input signal to generate an output signal, comprising the steps of:
conveying an input signal having an input signal value;
generating at least a first intermediate output signal having a first intermediate output signal value, by imposing predetermined first signal gain on the input signal;
generating at least a second intermediate output signal having a second intermediate output signal value, by imposing predetermined second signal gain on the input signal whereby the predetermined second signal gain is chosen at least ten times higher than the predetermined first signal gain;
selecting one of the first and second intermediate output signals as the output signal.

The output signal and/or the value its represents may be conveyed to a display and/or to a storage medium to be stored.

In accordance with still another aspect of the invention, there is provided a method of converting an analogue input signal to a digital output signal, comprising the steps of:
amplifying the analogue input signal having an input signal value in accordance with the method defined above to generate an analogue output signal; and
converting at least the analogue output signal to a digital output signal.

The digital output signal and/or the value its represents may be conveyed to a display and/or to a storage medium to be stored.

In accordance with still another aspect of the invention, there is provided a method of producing a mineral hydrocarbon fluid from an earth formation, the method comprising steps of:
drilling a well bore in the earth formation;
generating an electromagnetic induction signal of the earth formation;
amplifying the electromagnetic induction signal to generate an output signal, employing the steps of:

generating at least a first intermediate output signal having a first intermediate output signal value, by imposing predetermined first signal gain on the electromagnetic induction signal;

generating at least a second intermediate output signal having a second intermediate output signal value, by imposing predetermined second signal gain on the electromagnetic induction signal, whereby the predetermined second signal gain is chosen at least ten times higher than the predetermined first signal gain;

selecting one of the first and second intermediate output signals as the output signal;

further processing the output signal to locate the mineral hydrocarbon fluid in the earth formation;

continue drilling the well bore to the hydrocarbon fluid; producing the hydrocarbon fluid.

These and other features of the invention will be elucidated below by way of example and with reference to the accompanying drawing.

BRIEF DESCRIPTION OF THE DRAWING

In the figures of the accompanying drawing:

FIG. 1 schematically shows an amplifier in accordance with an embodiment of the invention;

FIG. 2 schematically shows the symbol used for representing an amplification unit;

In the Figures, like parts carry identical reference numerals.

DETAILED DESCRIPTION OF PREFERRED EMBODIMENTS

Figure 3:
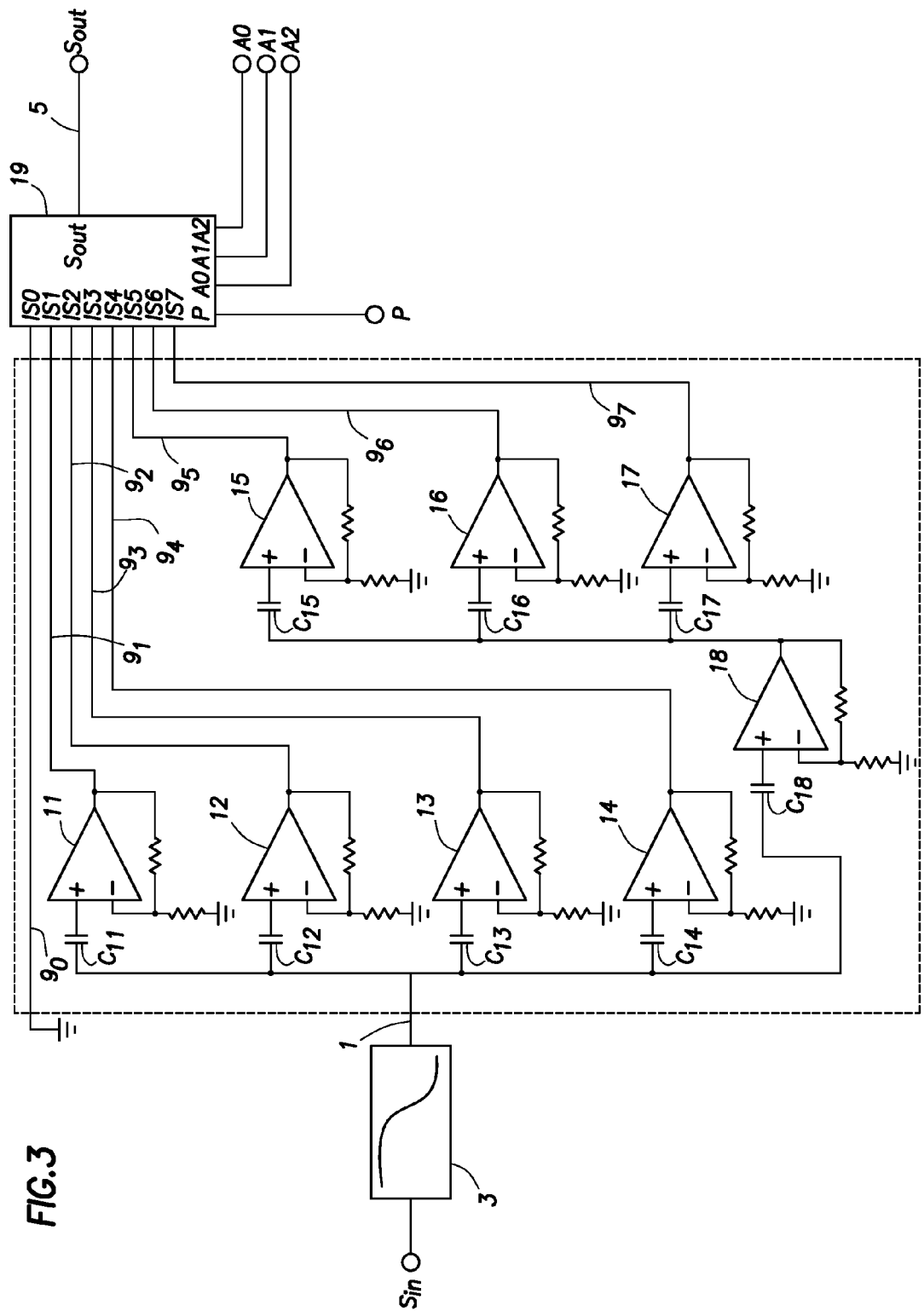
FIG. 3 schematically shows an amplifier in accordance with another embodiment of the invention.

FIG. 1 shows a schematic representation of an amplifier, comprising an input signal node 1 for conveying an input signal $S_{in}$ having an input signal value. The input signal may generally be either a DC or an AC signal. In the present specification it will be assumed to be an AC signal. Accordingly, the input signal value will be a time-dependent value.

The input signal node 1 may optionally be provided with a filter 3, which may be an active or a passive filter. In the embodiment as shown, the filter is provided in the form of a low-pass filter but a bandpass filter may be chosen depending on the type of input signal to be amplified. Its purpose is to avoid aliasing. Roll off frequencies and gradients (dB/octave) may be chosen as desired in dependence of the frequency range that is of interest. In the present embodiment, a low-pass filter with a 3 dB attenuation at 100 kHz is proposed.

Depending on the use of the amplifier, the filter may not be necessary. In some cases, the frequency response of the entire amplifier may provide the desired frequency characteristic, in which case a separate filter at the input is not necessary, either.

The input signal node 1 may optionally be provided with a shield driver to counteract any capacitive and/or inductive effect of any transmission line that may be present between the source of the input signal (such as a sensor) and the amplifier. An example of an active shield driver based on an integrated amplifier unit, such as for instance AD524, is provided in the datasheet for the AD524, herein incorporated by reference.

The amplifier circuit is further provided with an output signal node 5 for conveying an output signal $S_{out}$ having an output signal value. Also the output signal value may be time-dependent. The input signal may represent information about a physical object such as an earth formation, or a physical property thereof.

The amplifier is further provided with amplifier circuitry, generally identified at reference sign 7. The amplifier circuitry 7 is coupled to the input signal node 1 and provided with a plurality of intermediate output signal nodes $9_1$ to $9_7$ each for conveying an intermediate output signal ($IS_1$ to $IS_7$) each having an intermediate output signal value.

Any number N of intermediate output signal nodes may be provided. In the present embodiment, a selection was made N=7. The letter n will hereinafter be employed to indicate the n-th node out of the N available nodes, or the n-th signal conveyed by the n-th node.

The amplifier circuitry 7 further comprises a plurality of amplification channels, whereby each amplification channel is associated with one of the intermediate output signal nodes $9_1$ to $9_7$. The reference signals $9_n$ (n=1, 2, ..., N) may hereinafter be employed to make reference to either the intermediate output signal nodes or the corresponding amplification channel.

Each n-th intermediate output signal node $9_n$ is thus coupled to the input signal node 1 via its associated amplification channel $9_n$. Each amplification channel $9_n$ imposes a predetermined signal gain, $G_n$, to the input signal $S_{in}$. Thus, the intermediate output signal value in each of the intermediate output signal nodes $9_1$ to $9_7$ relates to the input signal value in accordance with predetermined consecutive signal gains imposed by the associated amplification channel. Or, in equation form:

$IS_n = S_{in} \times G_n$, whereby $n=1, 2, 3, \ldots, N$.

An amplification channel comprises one or more amplification units (illustrated in FIG. 1 at 11 to 17) to amplify the input signal in one or more stages. Amplification channels may be entirely independent from other amplification channels in the amplifier circuitry, or they may share one or more amplification units and stages with other amplification channels.

Taking the embodiment of FIG. 1 as an example, amplification channels $9_1$ and $9_2$ (associated with intermediate output signal nodes $9_1$ and $9_2$, respectively) each comprise one amplification unit, 11 and 12. Amplification channels $9_3$, $9_5$, and $9_6$ share amplification unit 13, which forms the only stage in amplification channel $9_3$ for intermediate output signal node $9_3$, and which forms a first stage in amplification channel $9_5$ and a first stage in amplification channel $9_6$. The second stage in amplification channel $9_5$ is formed by amplification unit 15, which receives the first-stage amplified signal from amplification unit 13. The second stage in amplification channel $9_6$ is formed by amplification unit 16, which receives the first-stage amplified signal from amplification unit 13. Amplification channels $9_4$, and $9_7$ share amplification unit 14, which forms the only stage in amplification channel $9_4$ for intermediate output signal node $9_4$, and which forms a first stage in amplification channel $9_7$. The second stage in amplification channel $9_7$ is formed by amplification unit 17, which receives the first-stage amplified signal from amplification unit 14.

FIG. 2 shows a non-inverting Op-amp arrangement which is the symbol used throughout the present specification to represent any type of amplifier unit, including for instance transistor based circuits, or integrated amplifier units such as for instance AD524SD, or more basic operational amplifier (Op-Amp) based amplifier circuitry (for instance LM 741) with more sophisticated feedback circuitry. The feedback circuitry as shown in FIG. 2 comprises a simple voltage divider comprising resistors $R_1$ and $R_2$, resulting in gain=1+ $R_2/R_1$.

Referring again to FIG. 1, consecutive signal gains $G_n$ and $G_{n+1}$, imposed by the consecutive amplification channels $9_n$ and $9_{n+1}$, differ from each other. In the embodiments as shown, the lowest signal gain is associated with the amplification channel $9_1$ and the highest with amplification channel $9_7$. Generally, the highest of the consecutive signal gains is at least ten times higher than the lowest of the predetermined signal gains so as to expand the dynamic range of the amplifier, by at least one decade. Preferably, the highest of the consecutive signal gains is at least 1000 times higher than the lowest of the predetermined signal gains.

In one embodiment, the gains of each amplification unit and amplification channels of FIG. 1 may be as set out in Table I below, resulting in signal gains $G_n$ in the consecutive amplification channels $9_n$ to increase by factors of ten.

TABLE I

| Amplification channel identifier $9_n$ | Stage 1 Amplif. unit | Stage 1 Unit gain | Stage 2 Amplif. unit | Stage 2 Unit gain | Channel gain $G_n$ |
|---|---|---|---|---|---|
| $9_1$ (n = 1) | 11 | 1 | — | — | 1 |
| $9_2$ (n = 2) | 12 | 10 | — | — | 10 |
| $9_3$ (n = 3) | 13 | 100 | — | — | 100 |
| $9_4$ (n = 4) | 14 | 1,000 | — | — | 1,000 |
| $9_5$ (n = 5) | 13 | 100 | 15 | 100 | 10,000 |
| $9_6$ (n = 6) | 13 | 100 | 16 | 1,000 | 100,000 |
| $9_7$ (n = 7) | 14 | 1,000 | 17 | 1,000 | 1,000,000 |

Optional series connected capacitors $C_{11}$ to $C_{17}$ may be provided in the amplification channels $9_1$ to $9_7$ to filter out any DC component in an essentially AC signal. In particular where multiple amplification units are series connected in one amplification channel it is advantageous to avoid further amplification of any DC offset that may be introduced by earlier amplification stages. Preferably, each amplifier unit 11 to 17 has such a capacitor at its input or output line.

Still referring to FIG. 1, the amplifier is further provided with a signal selector 19. Signal selector 19 comprises signal selector input nodes that are connected to the intermediate output signal nodes $9_1$ to $9_N$, and a signal selector output node that is connected to the output signal node 5. Signal selector 19 is arranged to select one of the intermediate output signals based on their values, and to present an output signal corresponding to the selected intermediate output signal on the output signal node 5.

An advantage of selecting on basis of the amplified intermediate output signal values, is that the selection strategy may be independent from the dynamic range of the amplifier. Would the selection have to be made based on, for instance, the original input signal value, it would be cumbersome to determine the best intermediate output node over the entire dynamic range, in particular when the dynamic range exceeds three orders of magnitude or so.

The output signal and/or the value its represents may be conveyed to a display and/or to a storage medium to be stored. The display and/or storage medium may be incorporated in a computer, such as a work station or a personal computer or the like. Examples of displays include a cathode ray tube such as a monitor or an oscilloscope, a pen plotter, a numerical display. A suitable storage medium may be for example photographic means, paper, or any computer readable storage medium, for example but not limited to, a hard disc, optical disc, magnetic disc, tape, magnetic tape, flash memory card, solid state random access memory (RAM), memory stick.

The signal selector 19 as shown has a capability of selecting one signal out of eight, whereas the amplifier circuitry 7 in the present embodiment only happens to comprise seven intermediate output signal nodes $9_1$ to $9_7$. In such a case, an eighth intermediate output signal node $9_0$ may be provided which may be connected to ground.

In the embodiment as shown, signal selector 19 also comprises an optional address output, which is here provided in the form of binary address nodes A0, A1, A2. The signal selector 19 is arranged to charge the binary nodes A0, A1, A2 with a binary code consisting of binary high (H) and low (L) values and identifying which one of the intermediate output signal nodes $9_0$ to $9_N$ has been selected and fed to the output signal node 5.

Three binary address nodes suffice to encode eight intermediate signal nodes. The various intermediate output signal nodes 9-1 to 9-N may for instance be coded as set forth in Table II, below.

TABLE II

| Node | A0 | A1 | A2 |
|---|---|---|---|
| $9_0$ | L | L | L |
| $9_1$ | H | L | L |
| $9_2$ | L | H | L |
| $9_3$ | H | H | L |
| $9_4$ | L | L | H |
| $9_5$ | H | L | H |
| $9_6$ | L | H | H |
| $9_7$ | H | H | H |

Any other coding is acceptable, provided that each node corresponds to a unique address code.

The signal selector 19 may also comprise an optional pacer input to take timing pulse information or synchroniser information. The timing pulse information may be functional to time latching of a selection, or new selections to be made or to trigger a machine state counter.

During operation, each amplification channel $9_n$ may continuously amplify the input signal $S_{in}$ by imposing a predetermined, and preferably constant, signal gain $G_n$. An output range may be determined, comprising a minimum output value and a maximum output value. At a certain given input signal value, the modulus of some of the intermediate output signal values may exceed the maximum value while the signal gain of others may not have been sufficient to yield an intermediate output signal value of which the modulus exceeds the desired minimum output value.

For example, the maximum output value may be chosen to disqualify amplification channels wherein amplification stages have saturated ("clipping") into an amplifier maximum output voltage (either positive or negative) of one or more of the amplification unit(s) in that channel. The minimum output value may be chosen to disqualify amplification channels that have not amplified enough to yield signal values that can be worked with.

The signal selector 19 serves to select the most suitable of the available intermediate signals at each time and connect the corresponding intermediate signal node to the output signal node 5. The signal selector may repeatedly or even continuously make a selection over time, to ensure that the desired one of the available intermediate signals is represented on the output signal node 5 even when the input signal value has changed. For repeated selection, the selection rate may be as high as needed, which depends on the desired bandwidth (or time-resolution) of detection.

The selection may be based on the intermediate signal that has been amplified at the highest signal gain without exceeding the predetermined maximum output value. Thus, a maximum output value may be set or defined, for instance close to but below the maximum output voltage of the amplification units, and the signal selector is preferably arranged to select out of the intermediate output signals the one of which the modulus has the highest value that is lower than the maximum output value.

The signal selector may, if necessary and in dependence with characteristics (e.g. involving slew rate) of the amplification channels, also observe a saturation recovery period before allowing a signal coming from a previously saturated amplification channel to be selectable. This would ensure that the amplifier channel has fully recovered from its saturation condition before being admitted to be selected.

This can be achieved in various ways. For instance, the maximum output value may be set sufficiently far below from the maximum output voltage of the amplification units, so that, by the time the amplification unit's output has come down to below the set maximum output value, the saturation recovery has already taken place. Or, a hysteresis may be provided in the selector such that the set maximum output value is temporarily selected lower during a period of time after saturation has occurred, for instance until the intermediate output signal has dropped below the temporarily lower set maximum output value. With such hysteresis provided, a higher range of intermediate signal values coming from the amplifier units remains available at time that no saturation has occurred.

By using the modulus of the intermediate output value, it is achieved that a signal within the range defined by minus the maximum output value and maximum output value is accepted.

More generally, the selection may be based on an acceptance window, in which the "largest" acceptable negative value (window lower limit) is independently definable from the largest acceptable positive value (window upper limit).

An advantage of the amplifier as set out above is that little or no time needs be lost due to gain switching, while at the same time the dynamic range is at least as large as the ratio between the maximum signal gain and the minimum signal gain available in the amplification channels.

FIG. 3 schematically shows a schematic representation of another amplifier embodiment. The embodiment shares essentially the same features as the previous embodiment as shown with reference to FIG. 1, but there is a modification in the amplifier circuitry 7. Not only amplification channels $9_1$ and $9_2$ (associated with intermediate output signal nodes $9_1$ and $9_2$, respectively) but also amplification channels $9_3$ and $9_4$ are separate from other amplification channels in the amplifier circuitry. Each of the amplification channels $9_1$ to $9_4$ as shown here consists of one amplification unit (11, 12, 13, 14, respectively), but of course two or more amplification units may be coupled in series if desired.

An amplification unit 18 has been provided in addition to the amplification units 11 to 17 of FIG. 1. The amplification unit 18 is shared by amplification channels $9_5$, $9_6$, and $9_7$, to form the first amplification stage of each of these amplification channels. The gains of each amplification unit and amplification channel of FIG. 3 may be as set out in Table III, below.

TABLE III

| Amplification channel identifier $9_n$ | Stage 1 Amplif. unit | Stage 1 Unit gain | Stage 2 Amplif. unit | Stage 2 Unit gain | Channel gain $G_n$ |
|---|---|---|---|---|---|
| $9_1$ (n = 1) | 11 | 1 | — | — | 1 |
| $9_2$ (n = 2) | 12 | 10 | — | — | 10 |
| $9_3$ (n = 3) | 13 | 100 | — | — | 100 |
| $9_4$ (n = 4) | 14 | 1,000 | — | — | 1,000 |
| $9_5$ (n = 5) | 18 | 1,000 | 15 | 10 | 10,000 |
| $9_6$ (n = 6) | 18 | 1,000 | 16 | 100 | 100,000 |
| $9_7$ (n = 7) | 18 | 1,000 | 17 | 1,000 | 1,000,000 |

In other embodiments, each amplification channel that consists of two or more stages may be set up having all stages exclusive to one amplification channel. This requires more components, but each amplification channel can thus be tuned individually with out disrupting other channels. Moreover, upon failure of one amplification unit only one amplification channel is disrupted whereas if a shared amplification unit fails (for instance amplification unit 18 in FIG. 3), all the amplification channels that make use of that unit would be disrupted.

Figure 4:
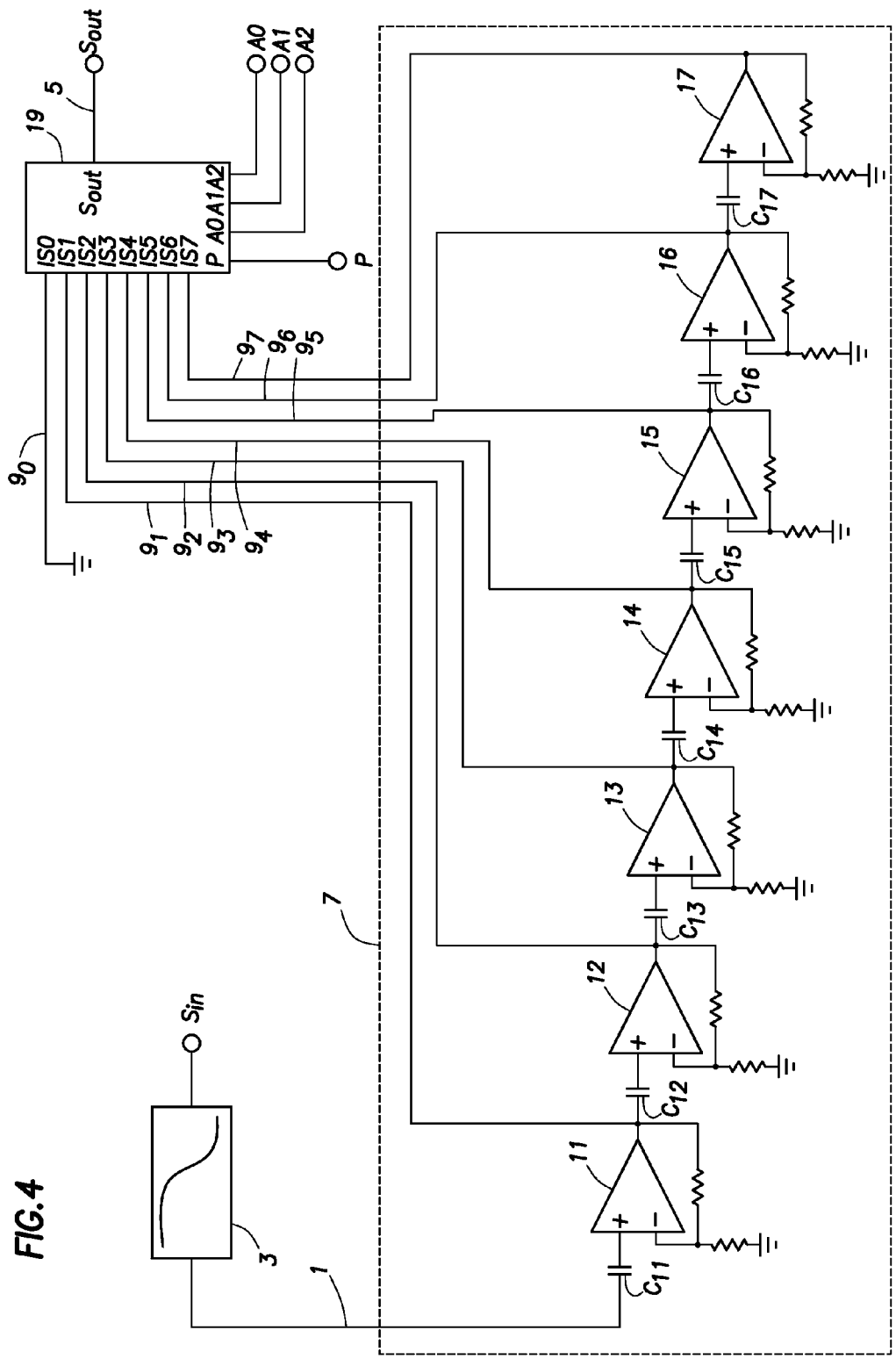
FIG. 4 schematically shows an amplifier in accordance with still another embodiment of the invention.

In still another embodiment, as set forth with reference to FIG. 4, all amplification units 11 to 17 are arranged in series connection. Thus, each amplification channel provides the first amplification stages of each subsequent amplification channel, because the output of each amplification unit is fed as input to the next amplification unit up. An advantage is minimal component requirement, but a drawback is that noise and other errors from the first stage will be amplified in each subsequent stage. The gain of the first amplification unit 11 may be unity, and of each subsequent amplification units (12 to 17) may be 10. Thus the signal gain in each subsequent amplification channel of FIG. 3 may be 10 times higher than in the previous one.

Optional capacitors $C_{11}$ to $C_{17}$ will help avoiding amplification of DC offset voltages.

Figure 5:
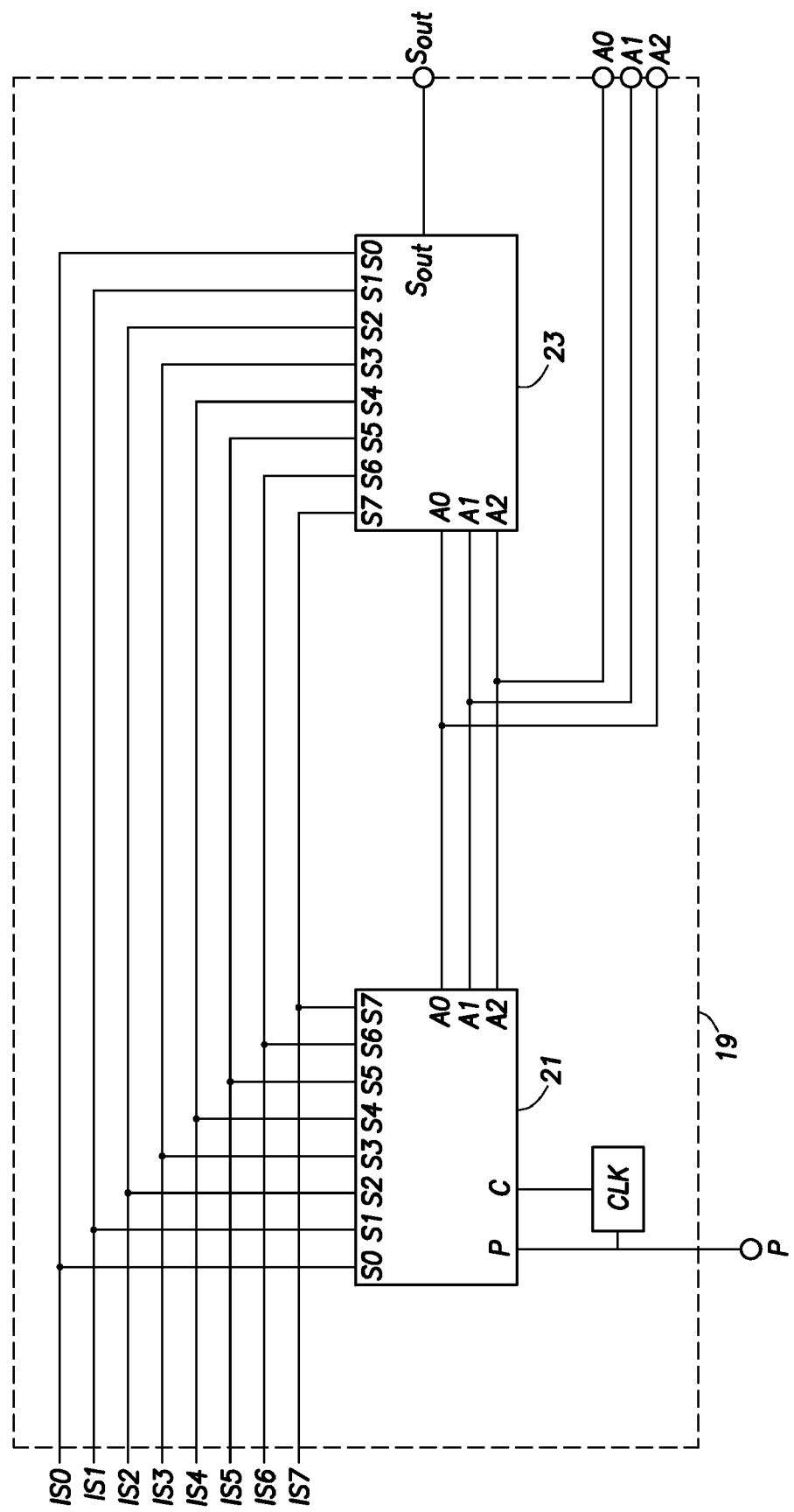
FIG. 5 schematically shows an example of a signal selector that may be included in the amplifier according to an embodiment of the invention.

Set forth below will be an example of a signal selector 19. FIG. 5 shows one embodiment of a signal selector 19 that comprises a clock oscillator CLK, a selection encoder 21 and an analogue signal multiplexer 23.

The CLK may be provided in the form of a crystal oscillator. The signal selector 19 as shown takes a pacer signal P as input. The pacer signal is connected to the CLK to allow for synchronisation of the CLK pulses to the pacer signal.

The intermediate output signal nodes $9_1$ to $9_7$ are connected both to the selection encoder 21 and the multiplexer 23. The multiplexer 23 gates one of the intermediate output signals to the output signal node 5. The selection encoder 21 is arranged to determine which one of the intermediate output signal nodes should be represented on the output node. The selection encoder may represent that information in the form of a binary code on address lines A0 to A2, which are connected to the multiplexer 23, and can be read and executed by the multiplexer 23.

The multiplexer 23 may comprise various gated switches, such as insulated gate bipolar transistors (IGBT), Field Effect Transistors (FET), including Metal on Silicon MOS-FETs. Such switches may be integrated in an integrated circuit. Examples of suitable integrated circuit multiplexers include ADG-508 or ADG-608, ADG-7508.

Figure 6:
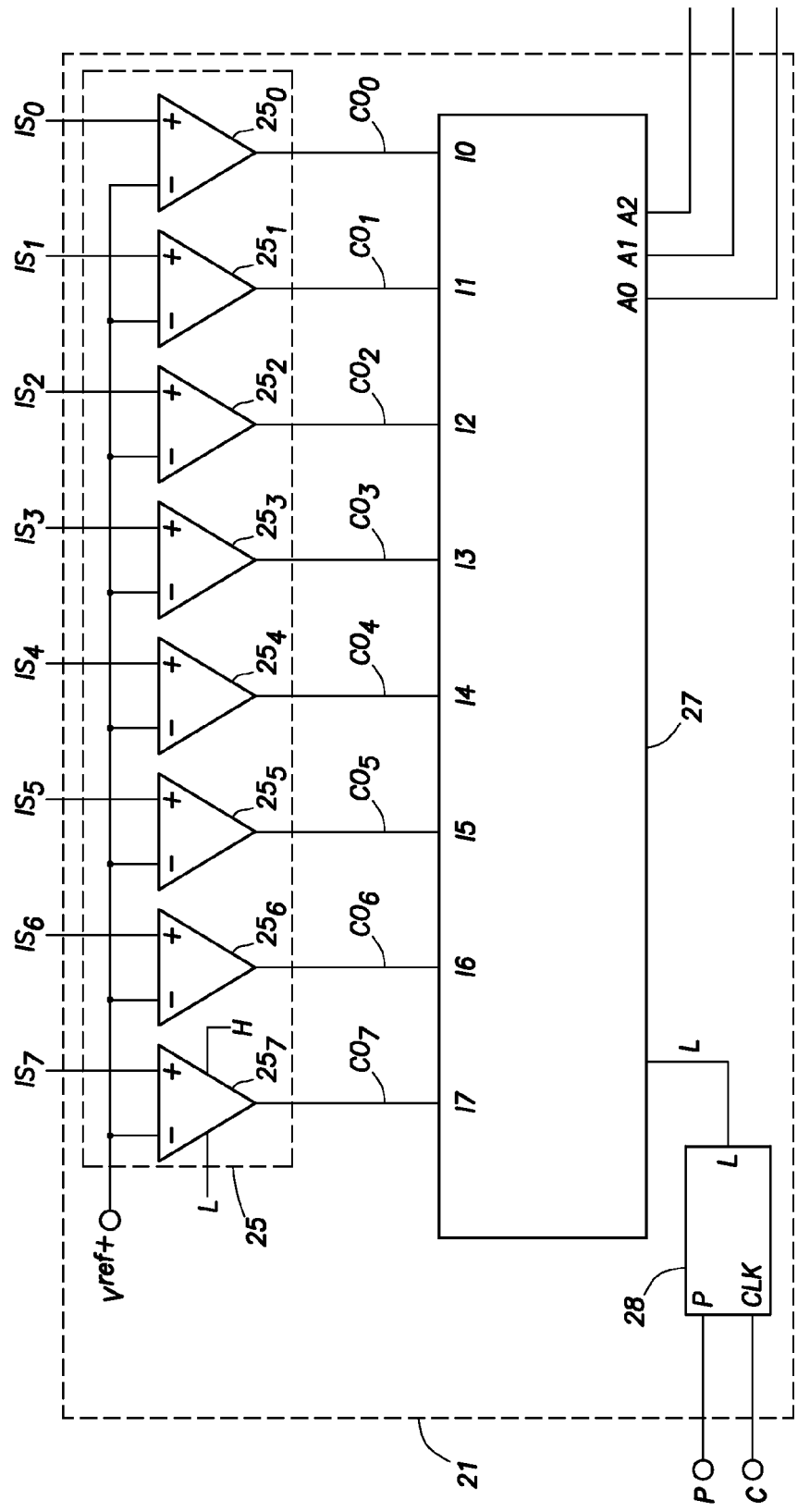
FIG. 6 schematically shows a selection encoder that may be included in the signal selector.

The selection encoder 21 may be embodied as illustrated by way of example in FIG. 6. It may comprise a comparator bank 25 and a priority encoder 27. It may also comprise steering logic 28 taking as input a clock pulse CLK and a pacer pulse P, and providing on its output a latch bit L.

In the shown embodiment, the comparator bank 25 comprises a number of comparators $25_0$ to $25_7$, each arranged to receive the intermediate output signal $IS_0$ to $IS_7$ and to generate an output on their respective comparator output I0 to I7. The comparators are arranged to compare the intermediate output signals $IS_0$ to $IS_7$ to a predetermined maximum value and to generate a digital information bit on the comparator outputs $CO_0$ to $CO_7$ identifying whether the intermediate output signal did or did not exceed the predetermined maximum value.

The comparators $25_0$ to $25_7$ may be provided in the form of operational amplifiers, of which the AD711 or LM741 series form a suitable examples, or any other high-gain amplification device, or more sophisticated differential comparator devices of which the LM161, LM261 and LM361 form examples. As shown here, the intermediate output signals ISO to $IS_7$ are fed to the non-inverting inputs of the respective operational amplifiers. The inverting input is connected to a DC voltage source to provide a reference voltage $V^{ref+}$ representing the predetermined maximum value.

All comparators $25_0$ to $25_7$ may be connected to a single DC voltage source for reference, or each may be connected to a dedicated one.

Configured as shown, a particular intermediate output signal $IS_n$ that is lower than or equal to the predetermined maximum value will cause the associated comparator $25_n$ to represent a low bit (0) on its comparator output line $CO_n$, whereas a high bit (1) is represented on the comparator output line $CO_n$ in case the intermediate output signal $IS_n$ exceeds the predetermined maximum value.

Of course, if desired the complementary bit values may be employed to represent whether the intermediate output signal is lower than the maximum value or not.

Figure 6A:
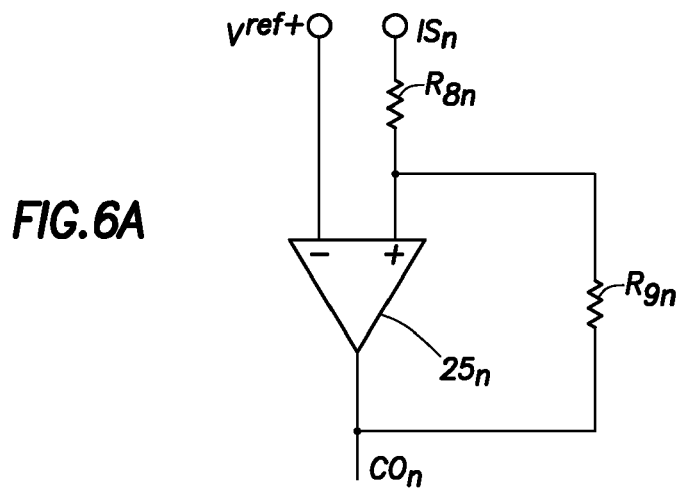
FIG. 6A schematically shows a comparator as employed in FIG. 6 provided with optional hysteresis feedback.

The comparators $25_0$ to $25_7$ may be provided with a little hysteresis to allow some relaxation time for a previously saturated amplification channel to fully recover from its saturation condition. There are various ways to achieve this, as is well known to the skilled person. As an example, one way of achieving some beneficial hysteresis shown in FIG. 6A provides an optional load resistor $R_{8n}$ in any selected particular intermediate signal line $IS_n$ of any particular comparator $25_n$, and a feedback resistor $R_{9n}$ connecting the comparator output $CO_n$ of the particular comparator $25_n$ to the non-inverting input of the particular comparator $25_n$. The effect is that, after the comparator has been forced to represent a high bit on its output line $CO_n$ the voltage that is fed into the comparator is increased while the reference voltage $V^{ref+}$ has remained unchanged. So the intermediate output signal $IS_n$ has to fall below the reference voltage $V^{ref+}$ by an amount equal to the increase before the comparator output $CO_n$ resumes its low bit output again.

Still referring to FIG. 6A, the amount of change in the in the voltage is governed by the relative value of $R_{9n}$ compared to $R_{8n}$. Typical suitable ratios could be anywhere between 5:1 and 100:1, e.g. about 10:1 depending on how much feedback is desired. The absolute value of $R_{8n}$ could be chosen such as to provide a reasonable load to the intermediate signal. A value of $R_{8n}$=10 kΩ has been found suitable but the value is not critical to the invention.

The comparator configurations shown above are only binary comparators, suitable for positive value input signals. In a more versatile embodiment, a window comparator configuration may be employed, for instance when it is anticipated that the input signal may be ranging from positive to negative values.

Figure 7B:
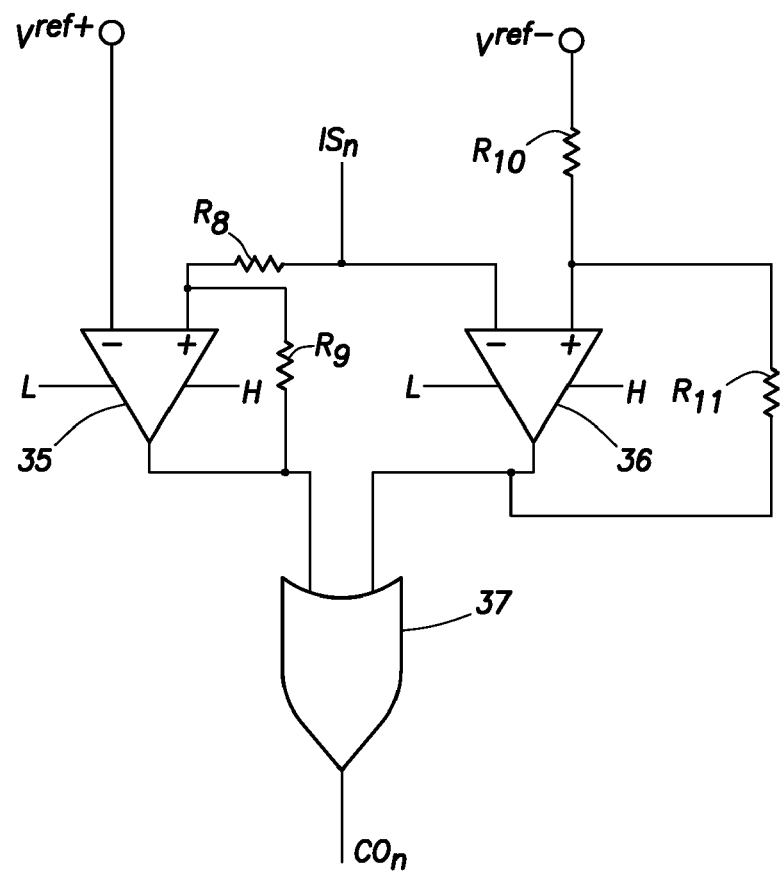
FIG. 7B schematically shows the alternative comparator of FIG. 7 provided with optional hysteresis feedback.
Figure 7:
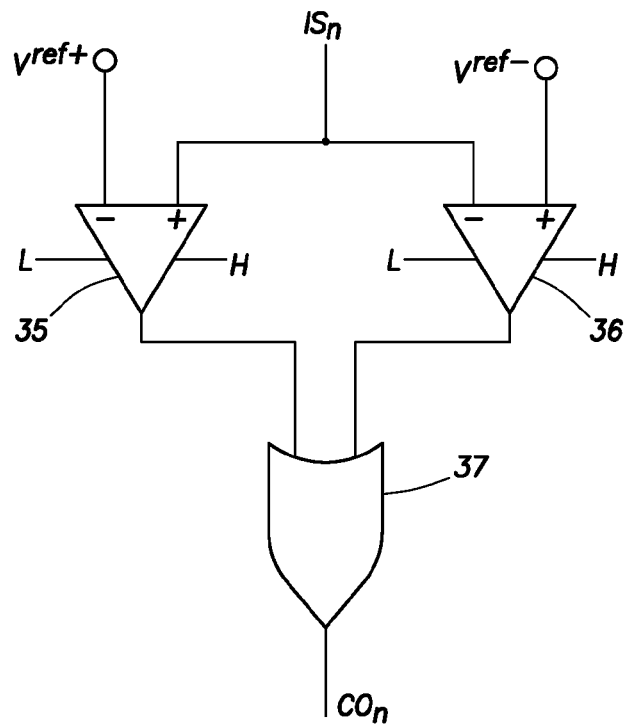
FIG. 7 schematically shows an alternative comparator that may be employed in the selection encoder.

An example of such a window comparator is shown in FIG. 7. Such a window comparator comprises a window upper limit comparator 35, a window lower limit comparator 36, and an OR gate 37.

Each intermediate output signal node may be connected to the non-inverting input of a window upper limit comparator 35, and to the inverting input of a lower limit comparator 36. The inverting input of the window upper limit comparator 35 is connected to a DC voltage source representing the window upper limit $V^{ref+}$, and the non-inverting input of the window lower limit comparator 36 is connected to a DC voltage source representing the window lower limit $V^{ref-}$. The outputs of the window upper limit comparator 35 and the window lower limit comparator 36 may be fed to an OR gate 37. The output of the OR gate 37 represents the comparator output.

Figure 7A:
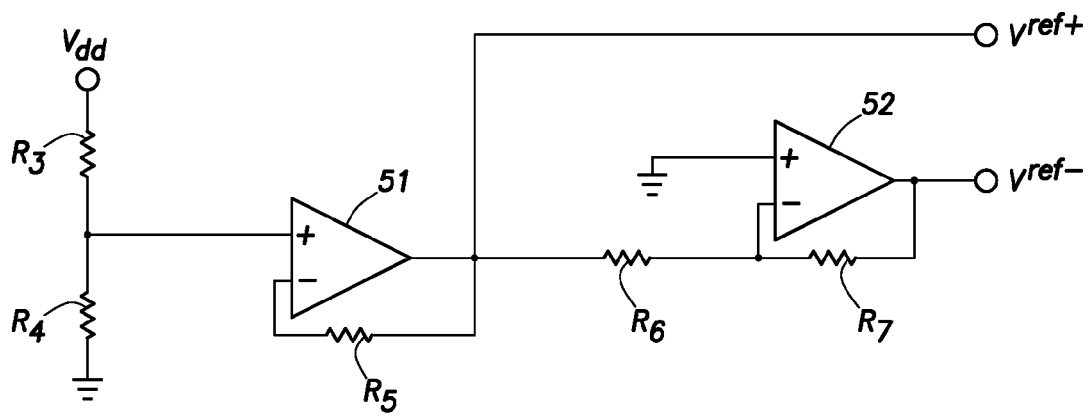
FIG. 7A schematically shows a voltage source for setting comparator input voltages.

FIG. 7A shows a possible circuit for generating the $V^{ref+}$ and $V^{ref-}$ inputs to the comparators 35 and 36 in order to achieve a bipolar comparator. It comprises a voltage divider, based on resistors $R_3$ and $R_4$ to connect the non-inverting input of a voltage follower to a predetermined fraction of a voltage $V_{dd}$. The voltage follower serves as an impedance buffer, and may comprise an amplifier 51 of which the output is fed back to the inverting input over a resistor $R_5$. The value of this resistor is not of big influence as long as it is small compared to the value of resistance between the inverting and non-inverting inputs to obtain a unity gain voltage follower. The output sets $V^{ref+}$. When an exact mirror image $V^{ref-}$ is desired, the output of the voltage follower may be fed to an invertor with unity gain. As shown in FIG. 7A, the output of amplifier 51 is fed to the inverting input of another amplifier 52 over resistor $R_6$. The output of the second amplifier 52 is fed back to the inverting input over a resistor $R_7$. Provided $R_6$=$R_7$, the resulting output $V^{ref-}$ will have the same modulus value as $V^{ref+}$. A suitable amplifier for this purpose is formed by TL072T op-amp.

In an advantageous embodiment, the voltage divider based on $R_3$ and $R_4$ is replaced by a digital to analogue converter. This would allow instantaneous control over the window range via a microprocessor.

Configured as shown in FIG. 7, a particular intermediate output signal $IS_n$ value that exceeds the window upper limit $V^{ref+}$ gives a high bit output value on the window upper limit comparator 35 and thus also on the comparator output. When the intermediate output signal value is lower (lower positive value or more negative value) than the window lower limit $V^{ref-}$, it will also cause a high bit on the comparator output because the window lower limit comparator 37 puts a high bit on the OR gate 37. However, when the intermediate output signal value is lower than or equal to $V^{ref+}$ and higher than or equal to $V^{ref-}$, both the upper limit and the lower limit comparators 35 and 36 will yield a low bit value and thus the output of the OR gate 37 will also be a low bit value.

Again, the meaning of low and high bit values may be interchanged depending on the remaining components.

FIG. 7B shows one implementation of how some optional hysteresis may be provided on the bipolar comparator. The upper limit comparator 35 may be provided with a feedback circuit as described above with reference to FIG. 6A for the binary comparator, employing a load resistor $R_8$ and a feedback resistor $R_9$. A similar feedback circuit may be provided on the non-inverting input of lower limit comparator employing a second load resistor $R_{10}$ and a second feedback resistor $R_{11}$. However, the load resistor is now in the $V^{ref-}$ line, and thus the lower reference is temporarily raised due to the feedback of a high bit output on the lower limit comparator until the output has resumed to low bit again. Preferably the ratio of $R_{11}$ to $R_{10}$ is the same as $R_9$ to $R_8$, but this is not a requirement.

In addition to comparator bank 25, the selection encoder 21 as shown in FIG. 6 further comprises a priority encoder 27, which accepts on its inputs I0 to I7 the bit values represented on the comparator outputs $CO_0$ to $CO_7$. In the present case, the priority encoder 27 operates on a so-called active-low coding of the inputs. The inputs are assigned ranked priorities, with the input line I7 connected to the amplifier channel $9_7$ with the highest signal gain having the highest priority and the input line I0 connected to the amplifier channel $9_0$ with the lowest gain having the lowest priority. As output, it has the binary address nodes A0 to A2, already mentioned above. The priority encoder loads the address nodes A0 to A2 with high and low bit representations in accordance with the code representing the highest priority active input (for instance, as set out in Table II, above). In the present example, a low bit value is considered "active" because the comparator bank 25 gives high bit values when the signal value is outside the predetermined range.

The priority encoder 27 may "continuously" update the output on the address nodes A0 to A2 as soon as the input node to which priority is assigned changes. However, when the latch signal L is active, the priority encoder 27 latches the address nodes to whatever value it had upon the latch signal becoming active.

An 8-input integrated circuit priority encoder that performs this function is the 74148 IC series, such as the "fast" 74F148. Equivalent alternatives exist, including active-high devices which of course require the intermediate output signals that to not exceed the maximum value, to be represented by a high bit value.

The amplifier embodiments as set forth above are based on seven amplification channels that each differ by a factor of ten in gain so that one amplification channel is available per decade. The invention also covers other numbers of amplification channels, which may reduce but preferably expand the dynamic range, decrease but preferably increase the number of amplification channels per decade or achieve change in both the dynamic range and the number of amplification channels per decade.

When the number of amplification channels exceeds eight, a signal selector with more inputs than eight is necessary. Usually, this can be built from eight-input technology components. For instance, a 16-input priority encoder, having a four-bit binary address output, may be made by combining two 8-input priority encoders in combination with appropriate logic gates. An example is provided in the Product specification data sheet of 74F148 8-input priority encoder, from IC15 Data Handbook Philips Semiconductors, dated 1990 Mar. 1, document order number 9397-750-05078, herein incorporated by reference.

Likewise, two eight-channel multiplexers may be addressed using a four-bit address line in combination with appropriate logic gates.

The logic functions comprised in the signal selector 19, (including the multiplexer 23, the state machine including counter and any logic required to keep track of various states, the priority encoder 27) may be provided in the form of standard IC components (such as discussed above) or they may be custom programmed in a so-called Field Programmable Gate Array (FPGA). An advantage of the latter is that the number of components is reduced, and that any input channels not employed do not have to be programmed.

It is known that amplifiers may display output drift as a result of variation in temperature. In applications where significant temperature variation is anticipated, the amplifier may preferably be located in a temperature stabilized environment. One was of achieving this is by means of a so-called ovenized environment that operates at a temperature above the highest anticipated ambient temperature. The heating power may be regulated to achieve a constant temperature in the ovenized environment.

Alternatively, temperature stabilized circuit components may be employed or output drift may be electronically compensated using temperature sensitive feedback circuitry.

The amplifier as described above may be combined with one or more analogue to digital converters (ADC). This way, an input signal can be digitised over a large dynamic range using a fairly constant granularity.

In one embodiment, each amplification channel is provided with a dedicated ADC, so that for each signal gain of amplification the full granularity of the ADC is available. The selection encoder may then, instead of the analogue comparator bank 25 as shown in FIG. 6, make a digital comparison. Such digital comparison may be performed using an overflow bit in combination with a priority encoder. Or, a serial read in combination with sample-and-hold circuitry as will be explained later herein.

When each amplification channel is provided with its own dedicated ADC, it would also be possible to convey each digitized intermediate output signal to a storage medium and/or a computer and then make a desired selection based on all available intermediate output signals later, for instance by selecting suitable parts out of all the available intermediate output signals and appending them together to form the output signal. In such a case, the signal selector comprises a computer.

In certain embodiments, however, an ADC is provided only in the selected signal output node. The signal selection may then be performed on basis of the analogue intermediate output signals, for instance using the signal selector 19 as shown in FIG. 5. Analogue signal comparison may be practically instantaneous compared to first digitizing and subsequently selecting. This is particularly so, when the ADC has a smaller bus size than digitising bits. Moreover, analogue comparison requires fewer components. Finally, a single amplifier or ADC converter having a multiplexed input from one of the amplification channels, will not exhibit non-linearities that may be induced by having a different ADC converter in each amplification channel. Any offsets, including those present in the multiplexer as well as in the ADC itself, will thus be of the same magnitude for all intermediate signal nodes.

Figure 8:
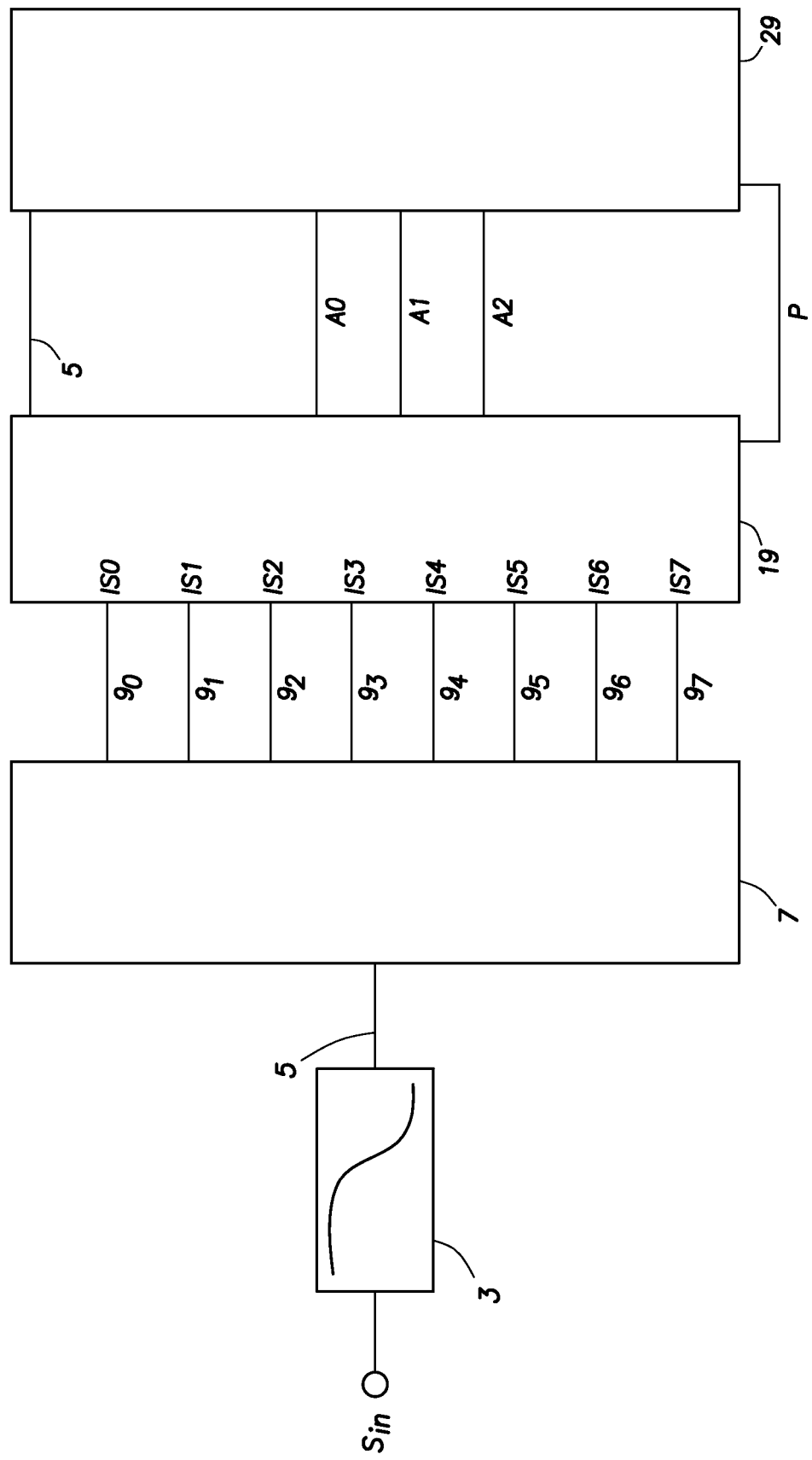
FIG. 8 schematically shows an analogue to digital converter according to an embodiment of the invention.

FIG. 8 shows an analogue to digital converter, wherein the output signal node 5 of any amplifier as described above is coupled to analogue to digital conversion circuitry 29 to convert the selected output signal to a digitised output. The digital conversion circuitry may comprise a microprocessor, for instance in the form of a personal computer, with ADC capability.

The digitised output signal and/or the value its represents may be conveyed to a display and/or to a storage medium to be stored in a similar way as described above in respect of the analogue output signals.

Depending on required operating conditions such as required speed, the number of bits or the equivalent granularity of the ADC may be selected. Typically, a 16-bit ADC has been found to present a good trade-off.

The digital address information A0 to A2, representing which one of the intermediate output signal nodes $9_0$ to $9_7$ is represented on the output signal node 5, is also fed to the digital conversion circuitry 29. This information may be translated to signal gain information, for instance using a table such as Table I or III, above, so that the original input signal value may be reconstructed from the digitised values by dividing the values by the appropriate signal gain factor.

Thus, the digital address information may be conveyed and stored together with the digitised output signal.

In general, sample and hold circuitry may be applied anywhere in the amplifier or analogue to digital converter. Sample and hold circuitry is known in the art, and reference is made to National Semiconductor Application Note 775, dated July 1992, for a detailed description of various architectures of sample-and-hold amplifiers. Note AN 775 is herein incorporated by reference.

Preferably, sample and hold circuitry is applied in each of the intermediate output signal nodes, or in the output signal node, as opposed to sample and hold circuitry being applied in the input signal node.

This way, the amplifier channels may constantly follow and amplify the input signal without being unnecessarily limited by the amplifier unit slew rate, and thereby avoiding any possible cause of over/undershoots that could influence the data in an unpredictable way.

In the embodiments as shown presently in the figures, the digital conversion circuitry may comprise sample and hold circuitry to hold a signal output value at a constant value for the duration required to digitise the data. Some commercially available ADC units have built-in sample and hold capability.

Figure 9:
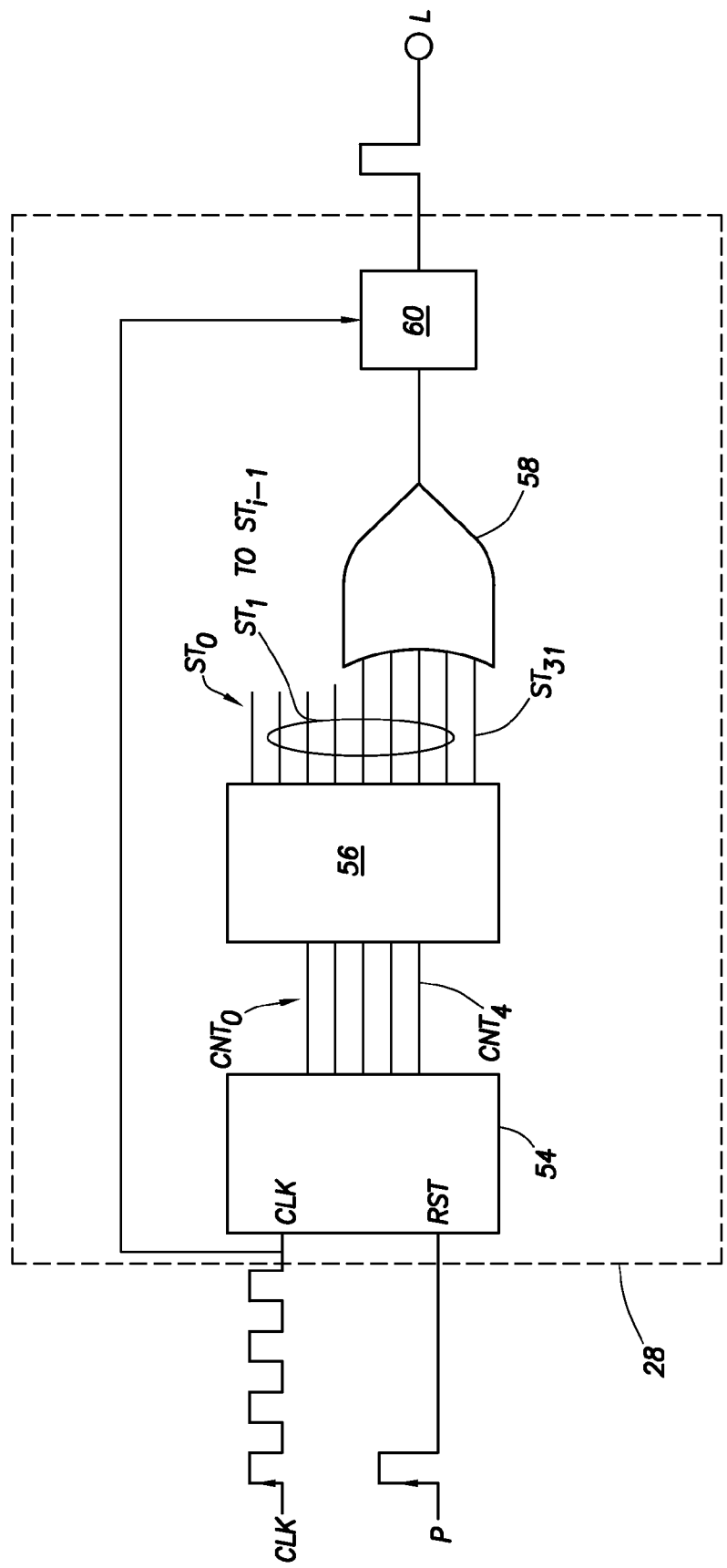
FIG. 9 schematically shows a state machine.

A pacer output line P may be provided to send a synchronizing trigger between the digital conversion circuitry and the signal selector 19 in the amplifier. In the present example, this may work as illustrated in FIG. 9.

As stated above, the signal selector 19 is driven by a clock signal CLK via a state machine. The clock signal may be generated by a crystal oscillator running at 20 MHz. A synchronous pulse counter 54 may be employed to steer the logic and perform actions at appropriate times. The counter counts CLK pulses that it receives on its CLK input and represents the number counted on the binary output lines $CNT_0$ to $CNT_4$. The number represented on the binary output lines $CNT_0$ to $CNT_4$ is reset to zero when the counter 54 receives a pacer pulse P on its RST input. The digital conversion circuitry may send out the pacer pulse P, which also synchronizes the clock (see FIG. 5). The lines $CNT_0$ to $CNT_4$ lines may be fed to a digital demultiplexer 56 which contains as many output lines $ST_0$ to $ST_i$ as necessary to represent all relevant states. With 5 CNT lines, i may be chosen 31. The demultiplexer 56 may present a non-active bit value on all state output lines except for one that corresponds to the count as represented on the CNT lines. A number of states may dictate require the address line values A0 to A2 to remain latched. One way of achieving this, is that the corresponding state output lines may be fed into an OR gate 58, which becomes active if any one of these corresponding states is active. The ultimate latch signal L may be presented after a short delay, to ensure that everything has stabilized before actually issuing the latching signal L. This may be achieved in a delay device 60, which may trigger, for instance, on a down going edge of the CLK signal.

As a result, the address line values A0 to A2 are latched after a predetermined number of clock signals, counted by the pulse counter 54, for some time before the next pacer pulse P is expected. This ensures that the output signal value, corresponding to the intermediate signal that is then gated by the multiplexer, can settle in the ADC. The rising edge of the next pacer pulse signals the beginning of the analogue to digital conversion, which may include sampling and holding the output signal value. At this point the state machine counter is reset again and the clock synchronized.

In alternative embodiments, sample and hold circuitry may be provided as part of the signal selector 19. In such embodiments, the intermediate output signals are held at triggered intervals for the duration of a holding time, during which a serial read could be made of the intermediate output signals starting with the one on which the highest signal gain was imposed, and selecting the first one that does not exceed the predetermined maximum value. With existing components, such serial read can be done within approximately 100 ns per intermediate signal node, so that eight nodes can easily be read within 1 microsecond and a selection rate of one per microsecond, or slower, can be maintained.

Instead of a relatively straight forward serial read, a so-called binary search could be employed which on average requires fewer reads than the serial reads.

The amplifier circuitry, as described above both generally and with particularity, functions to continuously follow the input signal conveyed on the input signal node, and to continuously and simultaneously generate consecutive intermediate output signals on the intermediate output signal nodes. Thus there is a choice of intermediate output signal having undergone different signal gains which differ by at least a factor of 10. Consequently, the effective dynamic range of the amplifier has been expanded by at least one order of magnitude. Instead of gain switching, one of the intermediate output signals may be selected, and at any moment it may be coupled to the output signal node.

The selection may be performed repeatedly or continuously over time, whereby either the same intermediate output signal is reselected or another one of the intermediate output signals is selected.

The selection may be based on the values of the (amplified) analogue values of the first and second intermediate output signals. The most suitable one to be selected may typically be based on whether the intermediate output signal value lies within a predetermined output signal range, can be selected. Often, the most suitable intermediate signal node, at a given time, may be the one that has the highest intermediate output signal value of which the modulus (or "absolute value") is still below a predetermined maximum output value.

The amplifiers and analogue to digital converters as described above may find any application where a large dynamic range amplification and/or digitalisation speed is required. The present amplifiers and analogue to digital converters are particularly advantageous for dynamic ranges of 1000 or more, typically between 1000 ($10^3$) and $10^{12}$, or between $10^3$ $^{and}$ $10^{10}$. The invention enables analogue to digital converters with such high dynamic ranges to be faster than 10 μs, typically between 0.1 μs and 10 μs.

Accordingly, the selection rate may be chosen between one per 0.1 microseconds and 10 microseconds.

Figure 10:
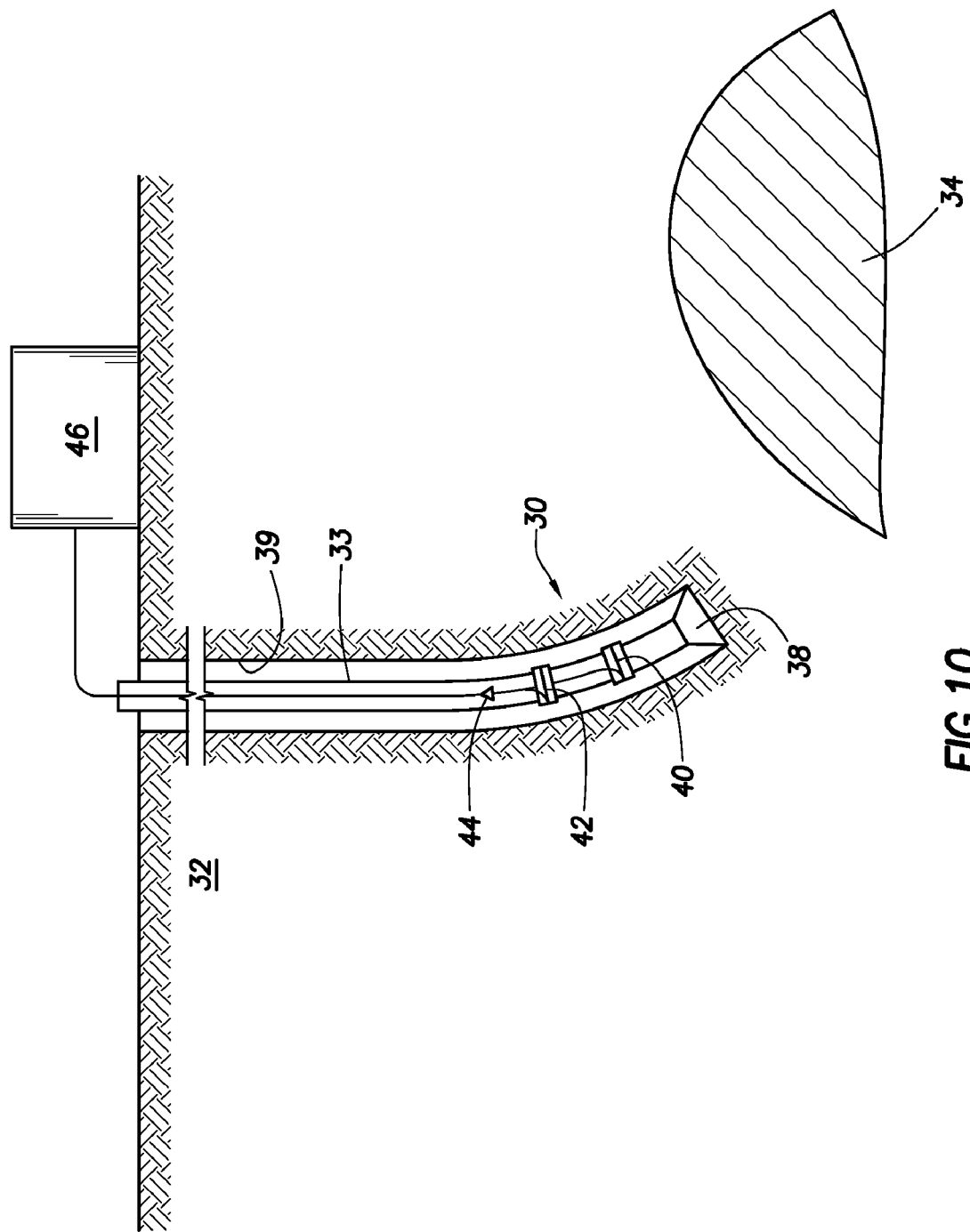
FIG. 10 schematically shows a down-hole tool in a bore hole in an earth formation.

In one application, the amplifier as described above, or the analogue to digital converter employing the amplifier, may be incorporated in a down-hole tool such as is exemplified in FIG. 10. This enables fast signal amplification and/or digitisation of fast time varying down-hole sensor data.

FIG. 10 shows a down-hole tool 30 for electromagnetic induction measurements of an earth formation 32. In the embodiment as shown, the down-hole tool 30 is incorporated in a drill string 33 supporting a drill bit 38 in a bore hole 39. A reservoir containing a mineral hydrocarbon fluid 34 is also present.

The down-hole tool 30 may typically be included in a measurement while drilling (MWD) device and/or in a bottom hole assembly (BHA). In other embodiments, the down-hole tool may be suspended in the bore hole on a wire line as is for example shown and described in U.S. Pat. No. 6,952,101, of which the contents are herein incorporated by reference.

The down-hole tool 30 as depicted in present FIG. 10 comprises a transmitter antenna 40 and a sensor in the form of a receiver antenna 42 displaced from the transmitter antenna 40 at a predetermined offset. The transmitter and receiver antennae may be provided in the form of coils as described in, for instance, U.S. patent application publications 2005/0092487, 2005/0093546, and 2005/078481, and in U.S. Pat. No. 5,955,884, herein incorporated by reference.

The tool 30 further comprises an amplifier 44 in accordance with the invention. The input signal node of the amplifier is coupled to the receiver coil. The (amplified) output signal node may be in communication with a surface computing unit 46, either in direct electrical contact or via a wireless telemetry system. The surface unit 46 may comprise a data acquisition and control system, including an analogue to digital converter to digitise the sensor data.

Alternatively, the down-hole tool 30 may comprise an analogue to digital converter as described above, comprising an amplifier according to the invention. An advantage of performing analogue to digital conversion downhole, is that less additional noise may be picked up while the data is transmitted to the surface computing unit 46.

In operation, a well bore may be drilled in the earth formation 32, in the form of bore hole 39.

An electromagnetic induction signal of the earth formation may be generated. Suitable ways of generating the electromagnetic induction signal are described in U.S. patent application publications 2005/0092487, 2005/0093546, and 2005/078481, and in U.S. Pat. No. 5,955,884, already incorporated by reference. An electromagnetic signal may be transmitted from the transmitter antenna 40 and an electromagnetic induction signal may be formed in the form of a response signal such as a voltage response or a current response in the receiver antenna 42.

The electromagnetic induction signal may be amplified to generate an output signal. The response signal may be amplified using an amplifier of the invention or a method of amplification of the invention. The amplifier of the invention is particularly suitable for detecting transient response signals following a sharp turn off of the transmitter antenna 40. Such signals decay rapidly in time over various decades.

The output signal may be further processed to locate the mineral hydrocarbon fluid in the earth formation. Details of possible processing are described in U.S. patent application publications 2005/0092487, 2005/0093546, 2005/078481, and 2006/0038571, and in U.S. Pat. No. 5,955,884, already incorporated by reference.

Drilling the well bore may be continued to the hydrocarbon fluid. Decisions may be taken, based on information about the location of the mineral hydrocarbon fluid in the earth formation, regarding the direction of continued drilling. Suitably, the drill string has directional drilling capability.

Once the bore hole extends into the reservoir with the mineral hydrocarbon fluid 34, the bore hole may be completed in any conventional way and the mineral hydrocarbon fluid may be produced.

We claim:

1. An amplifier comprising:
an input signal node for conveying an input signal having an input signal value;
an output signal node for conveying an output signal having an output signal value;
amplifier circuitry coupled to the input signal node and provided with at least a first intermediate output signal node for conveying a first intermediate output signal having a first intermediate output signal value, and a second intermediate output signal node for conveying a second intermediate output signal having a second intermediate output signal value, whereby the first intermediate output signal value relates to the input signal value in accordance with a predetermined first signal gain and the second intermediate output signal value relates to the input signal value in accordance with a predetermined second signal gain, which predetermined second signal gain is at least ten times higher than the predetermined first signal gain; and
a signal selector arranged to select one of the intermediate output signals and to feed the selected one to the output signal node;
wherein the signal selector comprises an analogue comparator bank to compare the intermediate output signal values against reference values.

2. An amplifier comprising:
an input signal node for conveying an input signal having an input signal value;
an output signal node for conveying an output signal having an output signal value;
amplifier circuitry coupled to the input signal node and provide with at least a first intermediate output signal node for conveying a first intermediate output signal having a first intermediate output signal value, and a second intermediate output signal node for conveying a second intermediate output signal having a second intermediate output signal value, whereby the first intermediate output signal value relates to the input signal value in accordance with a predetermined first signal gain and the second intermediate output signal value relates to the input signal value in accordance with a predetermined second signal gain, which predetermined second signal gain is at least ten times higher than the predetermined first signal gain; and
a signal selector arranged to select one of the intermediate output signals and to feed the selected one to the output signal node;
wherein the signal selector comprises an analogue multiplexer that is electrically coupled to the first and second intermediate output signal nodes, and to the output signal node.

3. The amplifier of claim 1, wherein the signal selector comprises a comparator bank and a priority encoder, the comparator bank having input lines and output lines, the input lines being electrically coupled to the first and second intermediate output signal nodes, and the output lines being coupled to the priority encoder.

4. The amplifier of claim 2, wherein the signal selector further comprises a comparator bank and a priority encoder, the comparator bank having input lines and output lines of which the input lines are electrically coupled to the first and second intermediate output signal nodes, and of which the output lines are coupled to the priority encoder, wherein the priority encoder comprises an address output line, and whereby the multiplexer is arranged to select the intermediate output signal in accordance with the address represented on the address output line, and to feed the selected one to the output signal node.

5. An amplifier comprising:
an input signal node for conveying an input signal having an input signal value;
an output signal node for conveying an output signal having an output signal value;
amplifier circuitry coupled to the input signal node and provided with at least a first intermediate output signal node for conveying a first intermediate output signal having a first intermediate output signal value, and a second intermediate output signal node for conveying a second intermediate output signal having a second intermediate output signal value, whereby the first intermediate output signal value relates to the input signal value in accordance with a predetermined first signal gain and the second intermediate output signal value relates to the input signal value in accordance with a predetermined second signal gain, which predetermined second signal gain is at least ten times higher than the predetermined first signal gain; and
a signal selector arranged to select one of the intermediate output signals and to feed the selected one to the output signal node;
wherein the moduli of the first and second intermediate output signal values each are one of lower than, equal to, or higher than a maximum output value, and wherein the signal selector is arranged to select out of the intermediate output signals the one that has the highest value that is lower than or equal to the maximum output value.

6. The amplifier of claim 1, the amplifier being incorporated in a down-hole tool.

7. The amplifier of claim 6, whereby the down-hole tool comprises a receiver antenna and whereby the input signal node is coupled to the receiver antenna.

8. An analogue to digital converter, comprising
an input signal node for conveying an input signal having an input signal value;
an output signal node for conveying an output signal having an output signal value;
amplifier circuitry coupled to the input signal node and provided with at least a first intermediate output signal node for conveying a first intermediate output signal having a first intermediate output signal value, and a second intermediate output signal node for conveying a second intermediate output signal having a second intermediate output signal value, whereby the first intermediate output signal value relates to the input signal value in accordance with a predetermined first signal gain and the second intermediate output signal value relates to the input signal value in accordance with a predetermined second signal gain, which predetermined second signal gain is at least ten times higher than the predetermined first signal gain;
a signal selector arranged to select one of the intermediate output signals and to feed the selected one to the output signal node; and
analogue to digital conversion circuitry, coupled to at least the one output signal node, to convert the selected output signal
wherein the amplifier circuitry is coupled to sampled-and-hold circuitry which is switchable between a holding state and a releasing state in response to a pacer signal, and wherein the analogue to digital converter further comprises a pacer signal generator for activating the pacer signal.

9. Method of amplifying an input signal to generate an output signal, comprising the steps of:
conveying an input signal having an input signal value;
generating at least a first intermediate output signal having a first intermediate output signal value, by imposing predetermined first signal gain on the input signal;
generating at least a second intermediate output signal having a second intermediate output signal value, by imposing predetermined second signal gain on the input signal, which predetermined second signal gain is chosen at least ten times higher than the predetermined first signal gain;
selecting one of the first and second intermediate output signals as the output signal by:
comparing the first intermediate output signal to a reference value in an analogue comparator and issuing a first comparison result;
comparing the second intermediate output signal to a reference value in an analogue comparator and issuing a second comparison result;
selecting one of the intermediate output signals based on the first and second comparison results.

10. The method of claim 9, wherein selecting one of the first and second intermediate output signals is done by continuously or repeatedly selecting one of the first and second intermediate output signals over time.

11. A method of producing a mineral hydrocarbon fluid from an earth formation, the method comprising steps of:
drilling a well bore in the earth formation;
generating an electromagnetic induction signal of the earth formation;
amplifying the electromagnetic induction signal to generate an output signal, employing the steps of:
generating at least a first intermediate output signal having a first intermediate output signal value, by imposing predetermined first signal gain on the electromagnetic induction signal;
generating at least a second intermediate output signal having a second intermediate output signal value, by imposing predetermined second signal gain on the electromagnetic induction signal, which predetermined second signal gain is chosen at least ten times higher than the predetermined first signal gain; and
selecting one of the first and second intermediate output signals as the output signal;
further processing the output signal to locate the mineral hydrocarbon fluid in the earth formation;
continuing drilling the well bore to the hydrocarbon fluid; and
producing the hydrocarbon fluid.

* * * * *